United States Patent [19]

Hess, Jr. et al.

[11] 3,972,037
[45] July 27, 1976

[54] PHASE CORRECTING DRIVE CIRCUIT FOR A MAGNETIC BUBBLE FIELD-ACCESS MEMORY

[75] Inventors: William Emil Hess, Jr., Piscataway; George Philip Vella-Coleiro, Plainfield, both of N.J.

[73] Assignee: Bell Telephone Laboratories, Incorporated, Murray Hill, N.J.

[22] Filed: June 30, 1975

[21] Appl. No.: 591,820

[52] U.S. Cl. .................... 340/174 TF; 340/174 GA
[51] Int. Cl.² ........................................ G11C 11/14
[58] Field of Search .............................. 340/174 TF

[56] References Cited
UNITED STATES PATENTS 3,720,883 3/1973 Hess, Jr. et al. .............. 340/174 TF
3,866,145 2/1975 Hess, Jr. et al. .............. 340/174 TF

*Primary Examiner*—James W. Moffitt
*Attorney, Agent, or Firm*—H. M. Shapiro

[57] ABSTRACT

A feedback loop coupled to a tuned circuit applies to an input of a comparator circuit arrangement a control voltage signal which is a function of the instantaneous current in the tuned circuit. The loop is employed to adjust the timing at which the comparator arrangement applies voltage-refresh pulses to the tuned circuit in response to a reference voltage signal supplied by an external clock. The timing at which the pulses occur is such that the current in the tuned circuit remains in phase with the reference voltage signal. Two like tuned circuits driven 90° out of phase provide the rotating magnetic field characteristic of magnetic bubble, field-access memories.

10 Claims, 5 Drawing Figures

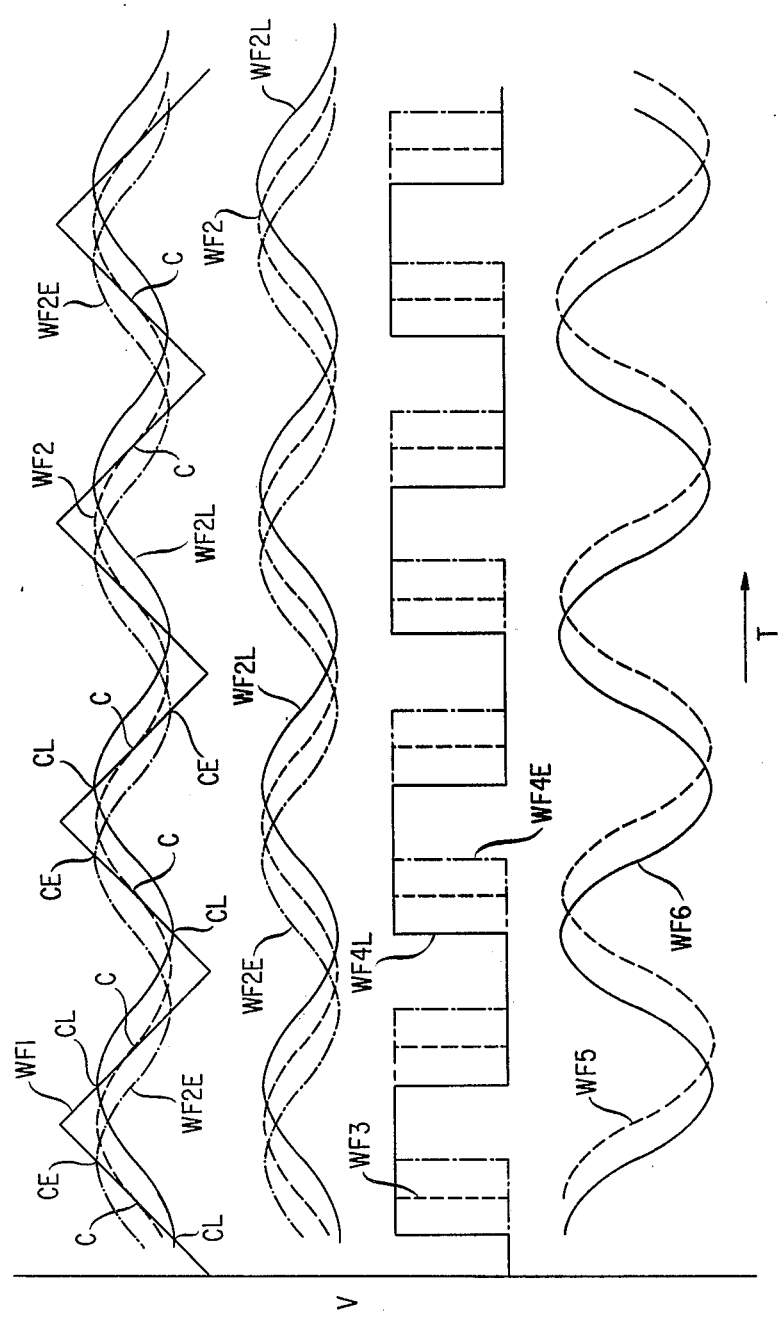

PHASE CORRECTING DRIVE CIRCUIT FOR A MAGNETIC BUBBLE FIELD-ACCESS MEMORY

FIELD OF THE INVENTION

This invention relates to magnetic bubble memories and more particularly to drive circuitry for such memories.

BACKGROUND OF THE INVENTION

A magnetic bubble memory operative in the "field access" mode is characterized by a pattern of magnetically soft elements, such as permalloy, formed in a plane and coupled to the bubble material. These elements are responsive to a magnetic drive field reorienting, typically by rotation, in the plane of the bubble material. The magnetic drive field is generated by a pair of tuned circuits driven in quadrature from an external clock as is well known. Any drift in the inductance or capacitance of the tuned circuits causes the resonant frequencies of the circuits to vary resulting in changes in current and thus in the phases of the drive field components. These changes, in turn, cause a reduction in the operating margins of the turn, cause a reduction in the operating margins of the memory.

In a practical memory arrangement, each tuned circuit is connected to ground via a transistor arrangement triggered by refresh pulses provided at a clock frequency. When the frequency of the tuned circuits varies, the phase of each circuit varies even more with respect to that of the clock signal due to the Q(>10) of the circuit. A problem thus exists with respect to maintaining the phase relationship between the external clock signal and the currents of the tuned circuits driven thereby when the resonant frequencies of the tuned circuits are different from the clock frequency.

BRIEF DESCRIPTION OF THE INVENTION

The phase relationship is maintained herein via a feedback loop adapted to apply a sinusoidal voltage to one input of a comparator to the other input of which a sinusoidal or triangular waveform is applied by an external clock. The comparator switches from one level to another at the time the two waveforms cross. The feedback loop is coupled to the tuned circuit and produces a sinusoidal voltage signal which is a function of the instantaneous current in the tuned circuit. When the phase of the current in the tuned circuit changes, the voltage signal applied to the comparator via the feedback loop provides a compensating change—i.e., the waveforms cross at different points—to adjust the phase of the (refresh) pulses generated by the comparator (via a one-shot pulse circuit). The output of the arrangement thus is a sequence of (square wave) pulses at the clock frequency adjusted in phase as a function of the phase of the current in the tuned circuit, the feedback loop being employed to adjust the phase of a (digital) pulse sequence with respect to an external clock signal. Two such comparator arrangements driven by clock (sine or triangular) waveforms 90° apart provide (refresh) pulse sequences to two tuned circuits each coupled to a feedback loop to so adjust the phases of the corresponding pulse sequences.

BRIEF DESCRIPTION OF THE DRAWING

FIGS. 2 and 4 are pulse diagrams of the circuits of FIGs. 1 and 3 during operation.

DETAILED DESCRIPTION

Figure 1:
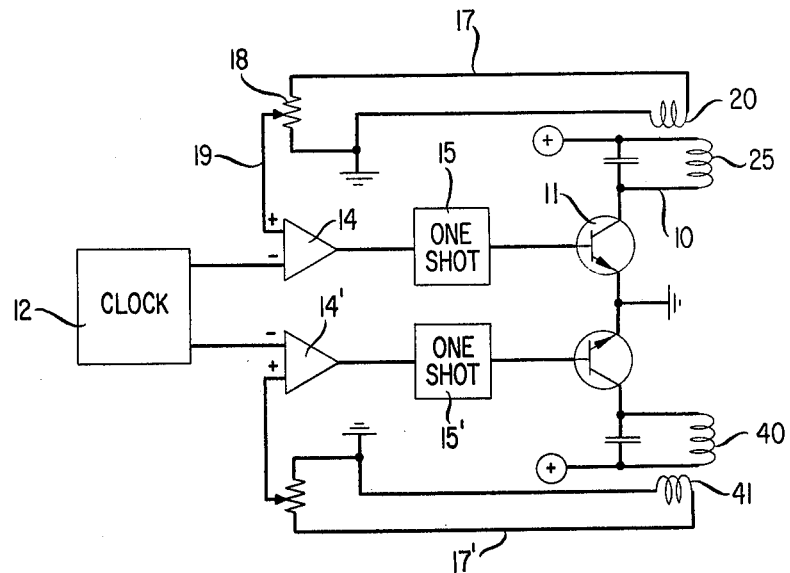
FIGS. 1 and 3 are circuit diagrams of magnetic bubble drive circuits including feedback phase-adjusting loops in accordance with this invention.

FIG. 1 shows a simple circuit diagram embodying the principles of this invention. The circuit includes a tuned circuit 10 connected to ground through the collector-emitter circuit of a transistor 11. An output of a clock circuit 12 is connected to the base of transistor 11 through a comparator 14 and a one-shot pulse circuit 15.

The circuit also includes feedback loop 17. The loop comprises (variable) resistor 18 and is connected to ground and to an input to comparator 14 by means of conductor 19. The loop also is inductively coupled, by inductor (or coil) 20, to tuned circuit 10. A voltage signal developed across resistor 18 is a function of the instantaneous current induced in coil 20 by changes in current in circuit 10.

The overall operation of the circuit is as follows: clock 12 applies a sine or triangular wave to an input of (high speed) comparator 14. The output signal of the comparator drives (monostable vibrator or one-shot pulse) circuit 15 which triggers illustratively on the positive edge of the signal. The output of circuit 15 drives transistor (class C amplifier) 11 which, in turn, drives the field coil 25 of tuned circuit 10 to a fixed voltage amplitude. Current transformer (inductor) 20 measures the coil (25) current and produces a voltage signal which is proportional to the instantaneous current in the coil. Since the clock frequency and the voltage amplitude of the coil are fixed, the coil current is determined by its inductance. Although the coil inductance varies with thermal expansion and aging, its effect on current is negligible. The coil current, therefore, is (assumed to be) constant making the output voltage amplitude of coil 20 constant.

But the phase of the coil current typically varies with respect to the reference clock due to a difference between the clock frequency and the tuned circuit resonant frequency. The phase shift is caused by aging and temperature changes in circuit 10 also and is non-negligible because it is a high order effect depending on the Q of the tuned circuit. This phase information is contained in the current of coil 20 and is fed back to the comparator as a trigger signal for comparator 14. The trigger signal continuously modifies the timing of the comparator output causing it to occur earlier or later with respect to the (sine or triangular) reference signal being applied by the clock. The result is to change the timing of the refresh pulse, supplied by the comparator (and one-shot pulse circuit) in a manner to maintain the current in coil 20 (and 25) in phase with the clock.

The phase correction may be understood more clearly from a discussion of FIG. 2. FIG. 2 is a pulse diagram of the operation of the circuit of FIG. 1. Clock 12 applies a triangular waveform, designated WF1 in FIG. 2, to an input of comparator 14. Feedback loop 17 applies a second waveform WF2 (typically of lower amplitude) to the second input of the comparator, waveform WF2 being in phase with the current in coil 20 (or 25). The comparator triggers where the waveforms cross, producing an outpt signal WF3. The crossings are indicated by points C. If the current in coil 20 is late in phase as indicated by feedback waveform WF2L, the crossings of waveforms WF1 and WF2L are early as indicated by points CL. On the other hand, if the current in coil 20 is early in phase, as indicated by waveform WF2E, the crossings are late as indicated at points CE. Thus, the output of the comparator is adjusted with respect to the original reference points C as indicated by output signals WF4L and WF4E.

If points C are taken to correspond to the ideal case representing the zero crossings which occur when the current in the tuned circuit is zero (a voltage maximum), comparator 14 clearly applies a refresh pulse to increase the voltage to the maximum when the current is zero. If on the other hand, the current (I) in the tuned circuit is late, the refresh pulses occur early with respect to points C (i.e., I ≠ 0). The voltage signal in coil 25 is represented by waveforms WF5 and WF6 for a crossing at points C and for an early crossing (points CL).

Coil 25 is one coil, for example, the outer coil in an arrangement of two orthogonally disposed coils which encompass an operating field-access, magnetic bubble memory. A second coil (an inner coil) is also necessary to provide the requisite rotating field for such a memory. The inner coil is designated 40 in FIG. 1 and is in a tuned circuit 41 driven exactly as is tuned circuit 10 and coupled to an associated feedback loop 17'. The driver for the inner coil includes a comparator 14' to an input of which clock 12 applies a signal 90° out of phase with respect to the signal applied to comparator 14. The output of comparator 14' is applied to one-shot pulse circuit 15'.

Figure 3:
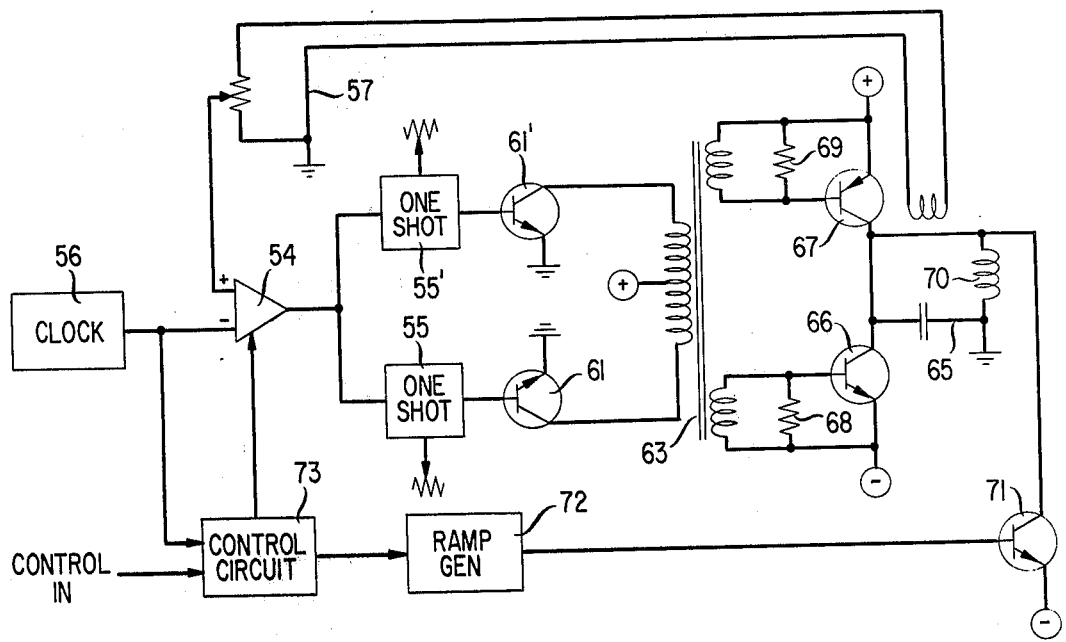

FIG. 3 shows a practical driver circuit for the outer field coil for a magnetic bubble, field-access, rotating field generator. The circuit is adapted for relatively high power uses but incorporates the essential features of the circuit of FIG. 1. In the circuit of FIG. 3, a comparator 54 applies an output pulse to two one-shot pulse circuits 55 and 55' in response to an input signal from clock circuit 56. The timing for the comparator output pulse is established by the voltage developed by feedback loop 57 as in the circuit of FIG. 1. Circuits 55 and 55' are adapted to respond to the positive-going and the negative-going edge of each output pulse of comparator 54, respectively. The outputs of circuits 55 and 55' occur every half cycle of the drive field when ideally the current in the tuned circuit is zero in a positive and in a negative direction. The width of the output is adjusted to supply energy lost by the tuned circuit during each cycle by the variable resistors indicated at each of circuits 55 and 55' in FIG. 3.

Circuits 55 and 55', more specifically, apply pulses to the bases of transistors 61 and 61', respectively. In response, current flows from, typically, a +12 volt supply first through the collector-emitter path of transistor 61, then through the collector-emitter path of transistor 61' thus providing current flow through the primary winding of a transformer 63.

Transformer 63 has two secondary windings each connected between the base and emitter electrodes of a transistor. Tuned circuit 65 is connected between ground and the collectors of the two transistors, designated 66 and 67 in the figure. The emitters of the transistors are connected typically to − and +30 volt supplies, respectively. Resistors 68 and 69 are connected between the base and emitters of the transistors in order to cut off transistors 66 and 67 except when they are pulsed by the secondary windings of transformer 63.

Each output pulse from comparator 54 results in, first, transistor 66 and then transistor 67 being activated causing current to flow in coil 70 of tuned circuit 65. Feedback loop 57 monitors the current in the coil producing a voltage which controls the timing of the comparator 54 output.

Once again, the circuit of FIG. 3 is one-half of the drive arrangement for the magnetic field which moves magnetic bubbles in a field-access arrangement. Each circuit drives a coil and the two coils are placed orthogonally with respect to one another as disclosed, for example, in U.S. Pat. No. 3,879,585 of A. H. Bobeck, R. F. Fischer, J. E. Geusic and T. J. Nelson, issued Apr. 22, 1975.

Figure 4:
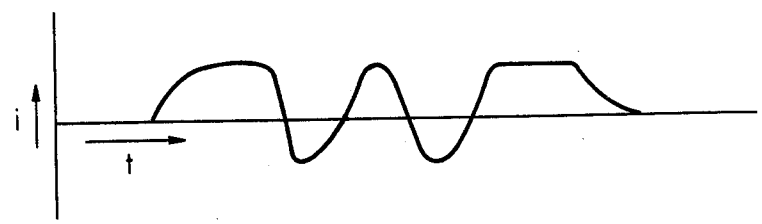

FIG. 3 also shows a transistor 71, the emitter-collector circuit of which is connected between typically a −30 volt supply and coil 70. The base of the transistor is connected to a ramp generator 72 which applies to it a ramp start and stop signal of the type shown as the waveform of FIG. 4 and disclosed originally in A. H. Bobeck, D. E. Kish and R. Kowalchuk, application Ser. No. 520,611, filed Nov. 4, 1974 and now U.S. Pat. No. 3,934,235. The stop and start pulses are provided in response to a signal from logic control circuit 73. Control circuit 73 also is operative to gate comparator 54 to an on state between start and stop pulses. The control circuit is responsive to an external circuit which may be activated in response to the depression of a repertory button as is the case in the above-mentioned U.S. Pat. No. 3,879,585.

Clock 56 of FIG. 3 is assumed to supply a triangular (or sinusoidal) waveform. Typically, a magnetic bubble, field-access memory includes logic circuitry where a square wave is available at 18 volts. Accordingly, in a practical arrangement, an amplifier and integrator circuitry is included to accomplish the necessary conversion of readily available signals into the (triangular) form called for herein.

Figure 5:
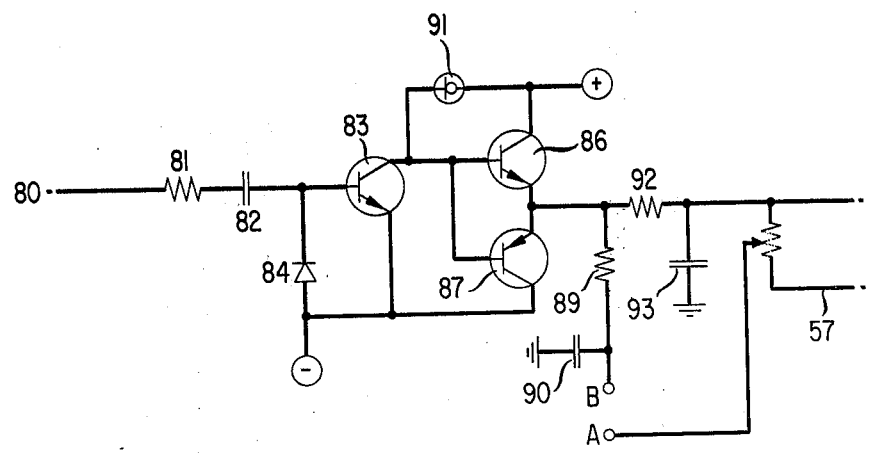
FIG. 5 is a circuit diagram of a portion of an input circuit for the circuit of FIG. 2.

FIG. 5 shows one circuit arrangement for accomplishing this conversion. A 100 kHz square wave is available in the typical bubble memory at a point designated 80 in the figure. the square wave is applied through a resistance 81 and a capacitor 82 to the base of transistor 83. The base and emitters of transistor 83 are connected, typically, to a −6 volt supply, the former via a diode 84 employed to avoid collecting a charge on capacitor 82. The collector of transistor 83 is connected to the bases of transistors 86 and 87. The collector of transistor 87 is also connected to the −6 volt supply, and the emitters of the transistors 86 and 87 are connected via resistance 89 and capacitor 90 to ground. Also the base of transistors 86 and 87 are connected via current limited diode 91 to the collector of transistor 86 (typically at +12 volts).

The transistors 83, 86, and 87 operate as an amplifier producing a square wave output at 18 volts. Resistance 89 and capacitor 90 integrate the square wave into a triangular waveform described in connection with FIGS. 1 and 2. A second resistance 92 and capacitor 93 define a second integrator chosen with values of resistance and capacitance to exhibit a long time constant and whose output is a steady voltage equal to the average value of the triangular waveform. Thus the second integrator biases the current transformer at the same average voltage as the triangular waveform being applied to the comparator of FIG. 3 at A.

In one specific embodiment of this invention a bubble memory operating at 100 kilohertz included a pair of rotating field drive coils where the outer coil had an inductance of 40 microhenries and a resistance of 1.4 ohms. The inner coil had an inductance of 30 microhenries and a resistance of 1.2 ohms. The outer and inner coils were characterized by losses of 1.4 and 1.2 watts, respectively. The clock signal was 1 volt and the feedback signal was adjusted to just short of 1 volt. The comparator provided a 5-volt, 5 microsecond pulse and the one-shot pulse circuit output pulse width was 200 nanoseconds.

What has been described is considered merely illustrative of the principles of this invention. Therefore, it should be understood that various modifications of this invention can be devised by those skilled in the art in accordance with those principles within the spirit and scope of the invention as encompassed by the following claims.

What is claimed is:

1. Apparatus for providing a rotating magnetic field for moving magnetic bubbles in a magnetic bubble memory, said apparatus comprising first and second tuned circuits and including first and second pulse generating means adapted for maintaining currents in said tuned circuits in a fixed phase relationship with one another, said pulse generating means being responsive to periodic clock signals for providing refresh pulses for refreshing the voltages in said tuned circuit to peak levels, and first and second feedback means coupled to said first and second tuned circuits, respectively, for applying to associated ones of said pulse generating means signals each in phase with that of the current in the associated tuned circuit for controlling the timing of the respective ones of said refresh pulses to adjust the voltage in the associated tuned circuit to a peak level in a manner so that the current in the associated tuned circuit is in phase with the clock signal.

2. Apparatus in accordance with claim 1 also including means for applying to said first and second pulse generating means periodic clock signals 90° out of phase with one another.

3. Apparatus in accordance with claim 2 wherein each of said pulse generating means includes a comparator, said apparatus also including a one-shot circuit responsive to the edge of each of said outpt pulses for applying a refresh pulse to associated tuned circuits.

4. Apparatus in accordance with claim 2 wherein each of said pulse generating means includes a comparator providing an output pulse, said apparatus also including first and second one-shot circuits responsive to the leading and trailing edges of each of said output pulses from the associated one of said comparators for applying said refresh pulses to associated tuned circuits.

5. A magnetic bubble memory arrangement comprising a circuit for regulating the phase of the current in a tuned circuit with respect to a clock signal, said circuit comprising pulse generating means responsive to said clock signal and a timing control signal for providing refresh pulses to said tuned circuit, and feedback means coupled to said tuned circuit and being adapted for applying to said pulse generating means a timing control signal in phase with the current in said tuned circuit for providing said refresh pulses in phase with said current.

6. A magnetic bubble memory arrangement including first and second circuits each in accordance with claim 5 in combination with means for providing to pulse generating means in said circuits periodic clock signals 90° out of phase with one another.

7. A magnetic bubble memory arrangement including a circuit in accordance with claim 5 wherein said pulse generating means includes a comparator having first and second inputs, said circuit also including clock signal generating means for applying said clock signal to said first input, said feedback means being adapted to apply said timing control signal to second input.

8. Apparatus for providing a magnetic drive for a magnetic bubble memory, said apparatus including a first tuned circuit and pulse generating means, said pulse generating means being responsive to first and second periodic input signals for applying to said tuned circuit an output pulse for refreshing the voltage therein to a given peak value when a crossing between said first and second signals occurs, said apparatus also including feedback means coupled to said tuned circuit and adapted to apply to said pulse generating means said first input signal, which is a function of the instantaneous current in said tuned circuit in a manner to adjust the timing of said crossings so that each refresh pulse is provided at a time to adjust the voltage in the tuned circuit to a peak level so that the current is in phase with the reference signal.

9. Apparatus in accordance with claim 8 wherein said pulse generating means includes a comparator having first and second inputs to which said first and second signals are applied, respectively.

10. A magnetic bubble memory comprising a film of magnetic material in which magnetic bubbles can be moved in response to a magnetic field rotating in the plane of said film, said memory including apparatus for providing said rotating magnetic field comprising first and second tuned circuits, and first and second pulse generating means, each of said pulse generating means being supplied with periodic clock pulses with a predetermined phase difference between the clock pulses, said first and second pulse generating means being adapted for supplying refresh pulses to the first and second tuned circuits, respectively, for maintaining current flow in said circuits with a phase difference between the currents, and feedback means coupled to the tuned circuits and operative upon the pulse generating means for maintaining the phase difference between the currents in the tuned circuits substantially equal to the phase difference in the clock pulses supplied to the generating means.

* * * * *